United States Patent [19]
Kim et al.

[11] Patent Number: 5,707,274
[45] Date of Patent: Jan. 13, 1998

[54] CHEMICAL MECHANICAL POLISHING APPARATUS FOR SEMICONDUCTOR WAFER

[75] Inventors: Yong-Kwon Kim, Cheongju; Young-Kwon Jun, Seoul, both of Rep. of Korea

[73] Assignee: LG Semicon Co., Ltd., Cheongju, Rep. of Korea

[21] Appl. No.: 756,559

[22] Filed: Nov. 26, 1996

[30] Foreign Application Priority Data

Jul. 9, 1996 [KR] Rep. of Korea ............... 27605/1996

[51] Int. Cl.$^6$ ................................................ B24B 5/00
[52] U.S. Cl. .................... 451/285; 451/286; 451/287; 451/288; 451/289; 451/41; 451/290; 451/177; 451/178
[58] Field of Search ............... 451/28, 41, 285–290, 451/63

[56] References Cited

U.S. PATENT DOCUMENTS 5,232,875  8/1993  Tuttle et al. ............... 437/225

FOREIGN PATENT DOCUMENTS 357089551  6/1982  Japan ............................ 451/28
7-66160  3/1995  Japan ...................... H01L 21/304

Primary Examiner—Robert A. Rose
Assistant Examiner—George Nguyen
Attorney, Agent, or Firm—Fleshner & Kim

[57] ABSTRACT

A chemical mechanical polishing apparatus for a semiconductor wafer which is capable of polishing uniformly the surface of the semiconductor wafer and of controlling the polishing amount by providing plurality of rotary drums each wrapped in a polishing cloth on the upper surface of a polishing pad and connecting supporters capable of vertical movement to both ends each rotary drum, and includes a rotatable polishing pad in the planar upper surface of which a plurality of recesses are formed for receiving a semiconductor wafer, a plurality of rotatable polishing units located on the polishing pad for planarizing the surface of the semiconductor wafers, a supporter connected at the endpoints of the rotational polishing units which can make a vertical movement, and a slurry applicator located above the rotational polishing units for putting a slurry thereon.

6 Claims, 4 Drawing Sheets

5,707,274

CHEMICAL MECHANICAL POLISHING APPARATUS FOR SEMICONDUCTOR WAFER

BACKGROUND OF THE INVENTION

1. Field of the Invention

The present invention relates to a chemical mechanical polishing apparatus for a semiconductor wafer, and in particular, to an improved chemical mechanical polishing apparatus for a semiconductor wafer which is capable of uniformly polishing the surface of the semiconductor wafer and of controlling the polishing amount by providing one or more rotary drums each wrapped in a polishing cloth and operable on the upper surface of a polishing pad, and connecting supporters capable of providing raising and lowering the rotary drums.

2. Description of the Conventional Art

According to the trend towards higher integration of semiconductor devices, a semiconductor device is fabricated by stacking a plurality of layers on a limited region of a semiconductor substrate. To planarize the surface of the thusly fabricated highly integrated semiconductor device, a chemical mechanical polishing (hereinafter, called CMP) apparatus is used. That is, the CMP apparatus is used not only for the planarization of a semiconductor substrate, but also for a global planarization of a highly integrated pattern on the semiconductor substrate.

Referring to FIGS. 1A and 1B, the conventional CMP apparatus according to U.S. Pat. No. 5,232,875 will now be explained in detail.

A polishing pad 10 has a planar upper surface 11, at the edge of which vertical barrier wall 13 is provided. On the planar upper surface of the polishing pad is provided a polishing cloth 12 having a predetermined thickness and a plurality of holes 18 and is protected by the barrier wall 13. The polishing pad 10 is connected to a driving assembly 14, and reference numeral 5 denotes a slurry supplied on the polishing cloth 12 from a slurry entrance(not illustrated).

A carrier 1 holds a semiconductor wafer 2 to be polished face down on a lower surface thereof, and a backing pad 3 is inserted between the held semiconductor wafer 2 and the planar lower surface 4 of the carrier 1. The carrier 1 is placed on the polishing cloth 12 on the polishing pad 10. Reference numeral 17 designates a resilient cushion to surround the inside of barrier wall 13 and the resilient cushion 17 corresponds to resilient bumps 16 formed at both sides of the carrier 1.

In the course of polishing, when the slurry 5 is supplied on the upper surface 12 of the polishing pad 10, the slurry 5 coats small holes 18 of the polishing cloth 12. The polishing pad 10 is rotated by the rotating force of the driving assembly 14, and the carrier 1 having the semiconductor wafer 2 attached to the lower surface thereof 1 conducts various motions on the polishing pad 10, such as a back and forth motion, an orbital motion or a random-direction motion. In accordance with the motions, the slurry 5 is coated on the semiconductor wafer 2 and the polishing cloth 12, and by abrasion, the surface of the semiconductor wafer 2 is polished.

But, the conventional CMP apparatus has a problem in that the polishing amount of the semiconductor wafer 2 cannot be measured during the polishing.

In addition, since the wafer is polished only by the rotation of the polishing pad with the carrier placed on the polishing cloth, the polishing amount of the semiconductor wafer 2 cannot be controlled. Besides, a plurality of wafers cannot be polished simultaneously.

Referring to FIGS. 2A and 2B, another example of the conventional CMP apparatus, as disclosed in unexamined Japanese patent publication 7-66160 will now be explained in detail.

A semiconductor wafer A is fixed on an absorbing platen 20 which is disposed in a recess 24a of the upper surface of a polishing pad 24.

The cylindrical surface of a rotary drum 26 is contacted on the semiconductor wafer A, and radially penetrating holes 40 are formed in the cylindrical surface of the rotary drum 26, and a polishing cloth 38 is wrapped around the cylindrical surface. As the rotary drum 26 is contacted on the upper surface of the wafer A, the rotary drum 26 can be moved back and forth by a supporter 28 attached to both ends of the rotary drum 26.

In the course of polishing, a slurry is supplied to the rotary drum 26 through a slurry supplying hose 36, and then is coated on the polishing cloth 38 through the penetrating holes 40. Then, as friction between the polishing cloth 38 and the surface of the semiconductor wafer A is produced, and the polishing operation proceeds.

But, the CMP apparatus is capable of measuring only a part of the polishing amount, and since the semiconductor wafer only rotates, during the polishing a difference in the polishing amount can result caused between the central portion and peripheral edge of the wafer, and the polishing is performed non-uniformly due to the difference in the force which is produced when the rotary drum makes a back-and-forth movement. In addition, because each semiconductor wafer is polished one by one, the productivity is low and mass production is impossible to achieve.

SUMMARY OF THE INVENTION

Accordingly, it is an object of the present invention to provide an improved CMP apparatus for a semiconductor wafer which is capable of measuring and controlling the polishing amount of the semiconductor wafer in the course of polishing.

It is another object of the present invention to provide an improved CMP apparatus for a semiconductor wafer which is capable of polishing the surface of the semiconductor wafer uniformly and of polishing a plurality of wafers simultaneously.

To achieve the above object, there is provided a CMP apparatus for a semiconductor wafer according to an embodiment of the present invention which includes a rotatable polishing pad in a planar upper surface of which a plurality of recesses are formed for each holding therein a semiconductor wafer, a plurality of rotary drum polishing unit disposable on the polishing pad for planarizing the surface of the semiconductor wafers, a supporter connected to the ends of each rotary drum for lifting and lowering the rotary drum, and a slurry applicator located above each rotary drum for applying a slurry thereto.

According to another embodiment of the present invention, the upper portion of the polishing pad can be formed to have a graded surface rising toward the central portion. In the course of the polishing, debris generated from the semiconductor wafers run down the graded surface of the polishing pad, and accordingly the debris is easily removed, resulting in obtaining a clean semiconductor wafer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
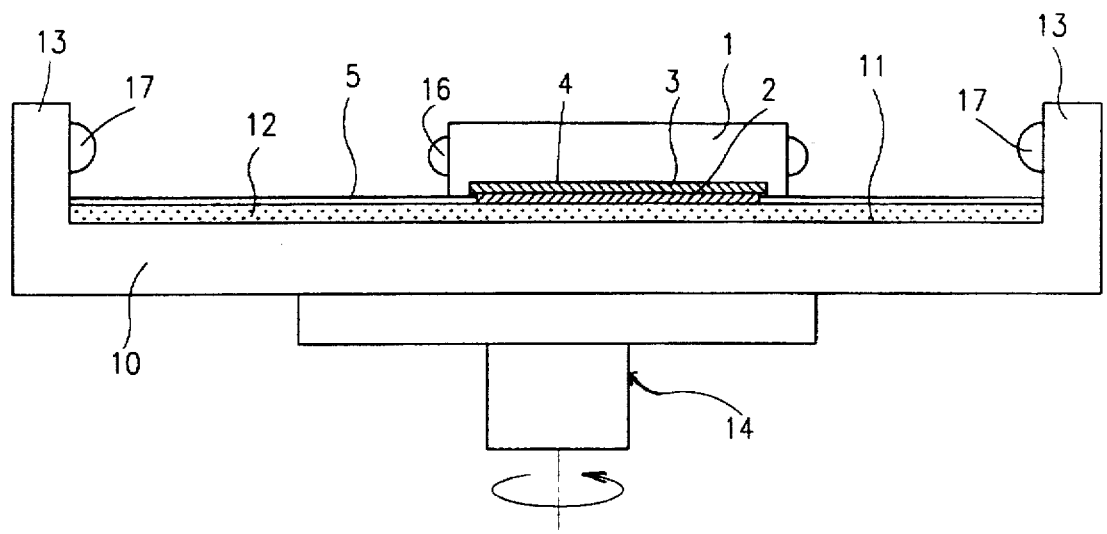
FIGS. 1A and 1B are views showing an embodiment of the conventional CMP apparatus.
Figure 1B:
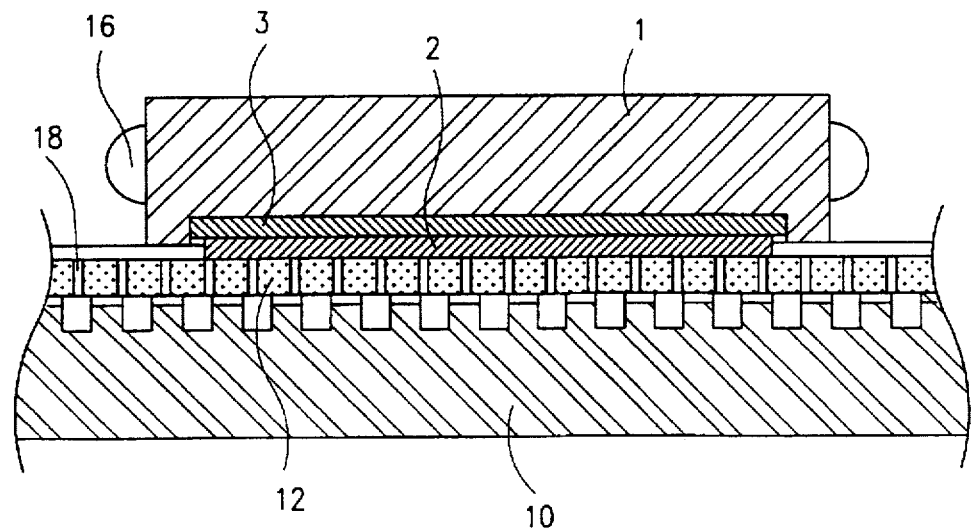
Figure 2A:
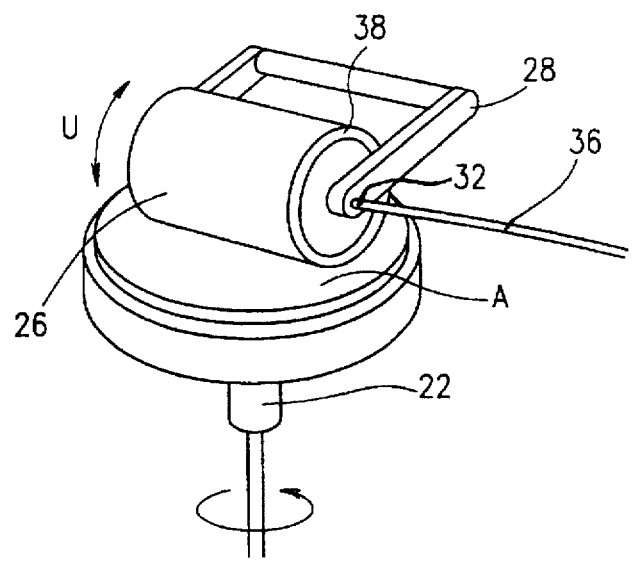
FIGS. 2A and 2B are views showing a conventional CMP apparatus.
Figure 2B:
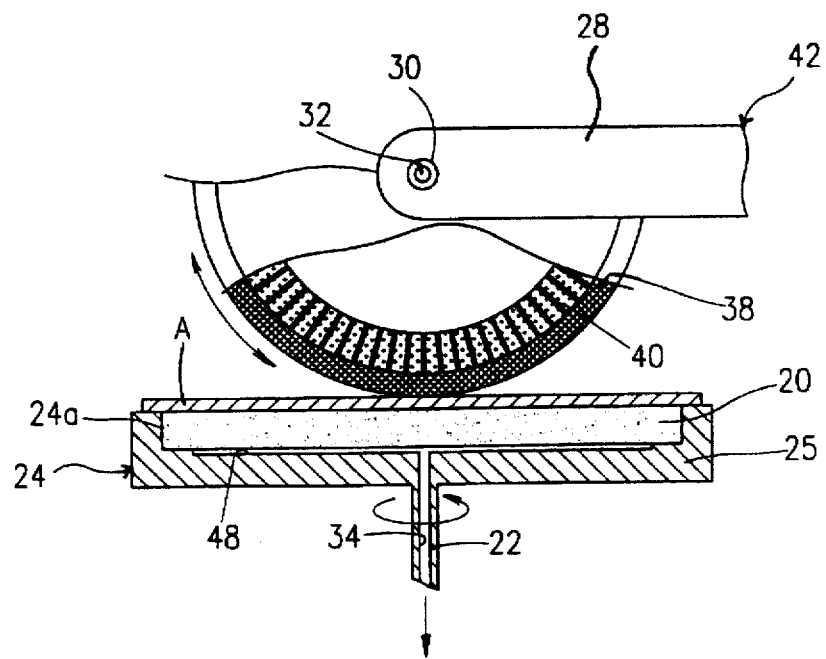
Figure 3A:
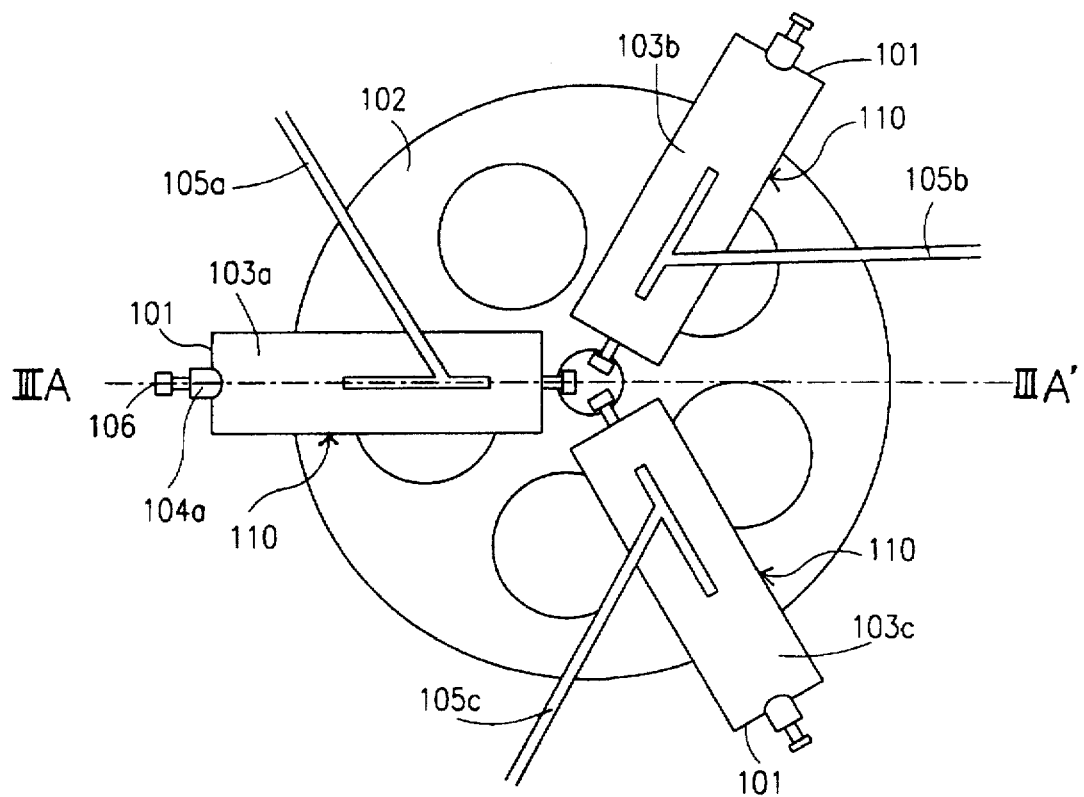
FIGS. 3A and 3B are a plan view and a cross-sectional view taken along line a–a', respectively, of a CMP apparatus for a semiconductor wafer according to a first embodiment of the present invention.
Figure 3B:
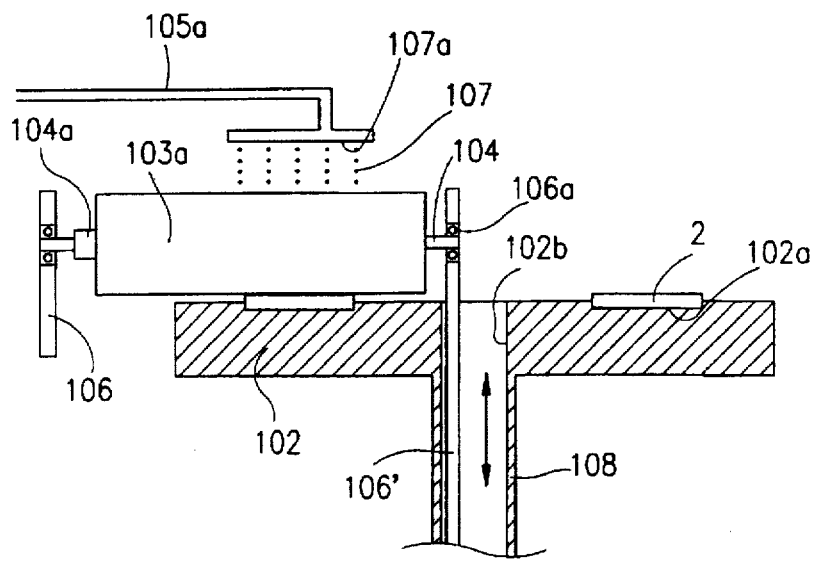

As shown in FIGS. 3A and 3B, in the upper surface of the polishing pad 102 are formed a plurality of circular recesses 102a for each receiving therein a semiconductor wafer 2, and on a central portion of a lower surface thereof is vertically integrally formed a driving shaft 108 having a hollow central part and communicating with a central hole 102b formed in the polishing pad.

Above the surface of the polishing pad 102, a plurality of polishing units 110(in the drawing, three are provided) are disposed which each include a rotary drums 101. The rotary drums 101 are wrapped by polishing cloths 103a,103b and 103c. The rotary drums 101 each have a respective rotating axis 104, and one end of each rotating axis 104 is rotatably connected to a support 106 in which a ball bearing 106a is equipped and the other end thereof is also rotatably connected to a supporter 106' having a ball bearing therein and provided in the central part of the polishing platen 102. The lateral length of the rotary drum 101 is sufficient to cover sufficient the diameter of the semiconductor wafer 2. At one side of the rotating axis 104 of each rotary drums is connected a driving motor 104a which can rotate the rotating axis 104 in accordance with an externally supplied electrical power.

Above each rotary drum 101 is located a slurry applicator 105a which has a slurry applicator exit 107a as long as the diameter of the semiconductor wafer 2 disposed in the recesses 102a on the polishing pad 102. The slurry applicator 105a supplies a shower of slurry 107 to the rotary drum 101 through the slurry applicator exit 107a. Another two slurry applicators 105a,105b perform the same function.

The end of the rotary drum 101 can be separated from the supporters 106,106' by separating the rotating axes 104 connected to the supporters 106,106'.

In the course of polishing, as the slurry 107 is supplied to the rotary drum 101 of each polishing unit 110 through the slurry applicator exit 107a, and coats the polishing cloths 103a,103b,103c, the polishing pad 102 having the plurality of the semiconductor wafer 2 disposed in its recesses 102a is rotated by the rotating force of the driving shaft 108, and accordingly the semiconductor wafers 2 start revolving. Then, the surfaces of the semiconductor wafers 2 are contacted by the polishing cloths 103a,103b,103c wrapping the rotary drums on which the slurry 107 is coated and are polished thereby.

In addition, the polishing amount of the wafer surface can be controlled while each rotary drum 101 can increase or decrease the pressure applied to the surface of the semiconductor wafer 2 by making a vertical movement of the supporters 106,106'.

Since the semiconductor wafer 2 is revolved and polished on the polishing pad 102, the surface of the semiconductor wafer 2 contacted with the surface of the rotary drum 101 can be polished uniformly and impartially. And, the polishing is carried out in a condition that the slurry is spread uniformly on the entire surface of the semiconductor wafer 2, and the polished material is easily removed from the polishing pad 102 to the exterior.

In the above-described polishing course, another polishing process can be performed by using other polishing cloths 103a,103b,103c on each rotary drum and supplying another kind of slurry.

Figure 4:
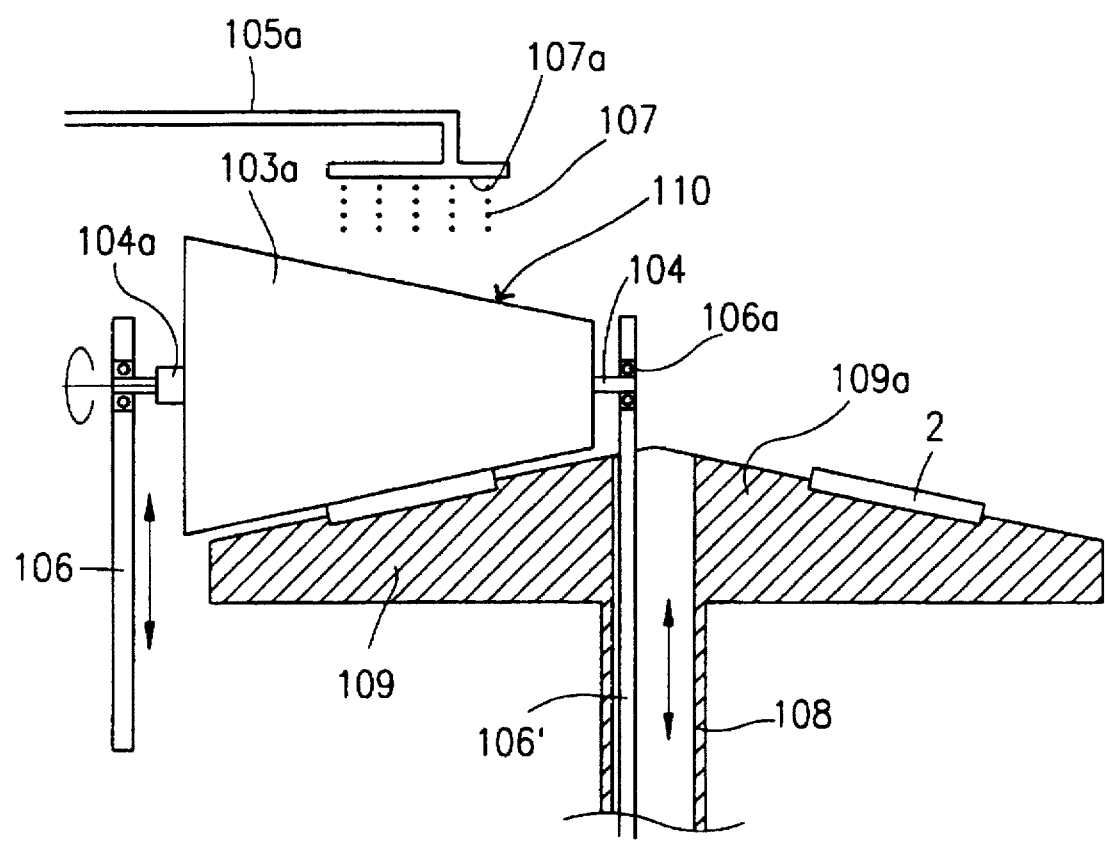
FIG. 4 is a cross-sectional view of a CMP apparatus for a semiconductor wafer according to another embodiment of the present invention.

FIG. 4 is a cross-sectional view showing a CMP apparatus for a semiconductor wafer according to another embodiment of the present invention. The upper surface portion of the polishing pad 109 is formed to have a graded surface 109a slanted upward towards the central part of the polishing pad 109.

In the course of polishing, the debris material generated by the semiconductor wafer 2 runs down along the graded surface 109a of the polishing pad 109, and is easily removed, resulting in achieving a cleaner semiconductor wafer.

The rotary drum 101 has a conical-shape having both ends of different diameters, but can be manufactured as a cylindrical roller-shape having a uniform diameter. The rotary drum 101 can be separated from the supporters 106,106' by separating the rotating axis 104 connected to the supporters 106,106'.

As described above, the CMP apparatus for a semiconductor wafer according to the present invention has the effect that the polishing amount of the semiconductor wafer can be measured and controlled in the course of polishing, and the surface of the semiconductor wafer can be uniformly polished since the surface of the semiconductor wafer is contacted with the surface of the rotary drum.

In addition, since a required amount of the slurry is supplied through the slurry applicator as a shower, the spending of the slurry can be reduced.

Further, because a plurality of semiconductor wafers can be polished simultaneously, the productivity can be enhanced to a great extent, and the polishing amount of the semiconductor wafers can be measured and controlled.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed:

1. A chemical mechanical polishing (CMP) apparatus for a semiconductor wafer, comprising:

a rotatable polishing pad in a planar upper surface of which a plurality of recesses are formed for each receiving therein a semiconductor wafer;

a plurality of rotatable polishing means disposed on the polishing pad for planarizing the surfaces of the semiconductor wafer;

a vertically movable supporter means connected at endpoints of each polishing means; and a slurry applicator located above each polishing means for applying a slurry thereto.

2. The CMP apparatus of claim 1, wherein the polishing means includes:

a rotary drum wrapped with a polishing cloth;

a rotating axis connected to a central portion of the rotary drum; and a driving motor connected to the one end of the rotary axis.

3. The CMP apparatus of claim 2, wherein the rotary drum is shaped to be conical.

4. The CMP apparatus of claim 1, wherein each slurry applicator supplies a different kind of slurry.

5. The CMP apparatus of claim 4, wherein the slurry applicator has a slurry applicator exit which is longer than a diameter of a semiconductor wafer.

6. The CMP apparatus of claim 1, wherein the upper surface of the polishing pad is formed to have a graded surface rising towards a central portion thereof.

* * * * *